(12) United States Patent
Kang et al.

(10) Patent No.: US 12,538,585 B2
(45) Date of Patent: Jan. 27, 2026

(54) ESD PROTECTION CIRCUITRY, AND ELECTRONIC DEVICE INCLUDING ESD PROTECTION CIRCUITRY

(71) Applicant: SAMSUNG ELECTRONICS CO., LTD., Suwon-si (KR)

(72) Inventors: Hyunsuk Kang, Suwon-si (KR); Jehoon Kim, Suwon-si (KR); Jungjune Park, Suwon-si (KR); Chiweon Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 139 days.

(21) Appl. No.: 18/614,152

(22) Filed: Mar. 22, 2024

(65) Prior Publication Data
US 2024/0321866 A1   Sep. 26, 2024

(30) Foreign Application Priority Data

Mar. 24, 2023 (KR) .................. 10-2023-0038950
Apr. 26, 2023 (KR) .................. 10-2023-0054968

(51) Int. Cl.
*H10D 89/60*      (2025.01)
*H02H 9/04*       (2006.01)

(52) U.S. Cl.
CPC .......... *H10D 89/819* (2025.01); *H02H 9/046* (2013.01)

(58) Field of Classification Search
CPC ............................ H10D 89/819; H02H 9/046
USPC ......................................................... 361/56
See application file for complete search history.

(56) References Cited

U.S. PATENT DOCUMENTS

| | | | | |
|---|---|---|---|---|
| 5,838,146 A | * | 11/1998 | Singer | H02H 9/046 323/270 |
| 5,946,177 A | * | 8/1999 | Miller | H10D 89/60 361/56 |
| 6,617,906 B1 | * | 9/2003 | Hastings | H03K 17/102 327/309 |
| 6,671,153 B1 | | 12/2003 | Ker et al. | |
| 7,518,841 B2 | * | 4/2009 | Chuang | H10D 89/819 361/56 |

(Continued)

FOREIGN PATENT DOCUMENTS

| | | | | |
|---|---|---|---|---|
| CN | 106098683 A | * | 11/2016 | ............ H10D 89/60 |
| CN | 114725087 A | * | 7/2022 | ........ G01R 31/2856 |
| WO | WO-03063203 A2 | * | 7/2003 | ........... H10D 89/711 |

*Primary Examiner* — Dharti H Patel
(74) *Attorney, Agent, or Firm* — Sughrue Mion, PLLC

(57) ABSTRACT

An electrostatic discharge protection circuit includes an NMOS transistor connected to a supply voltage pin through a first node and connected to a ground pin through a second node, an RC circuit connected in parallel with the NMOS transistor and including a capacitor and a resistor, and a clamping circuit connected in parallel with the resistor of the RC circuit and including a plurality of diodes; and a switch connecting the clamping circuit to a gate node of the NMOS transistor, wherein a number of the plurality of diodes is set based on a breakdown voltage and an operating voltage of an internal circuit to be protected by the ESD protection circuit, and the switch includes a PMOS transistor connecting the gate node of the NMOS transistor to the clamping circuit and a sub-RC circuit connected in parallel with the PMOS transistor and including a sub-capacitor and a sub-resistor.

20 Claims, 11 Drawing Sheets

(56) References Cited

U.S. PATENT DOCUMENTS

| | | | |
|---|---|---|---|
| 7,589,944 B2* | 9/2009 | Mergens | H03K 17/0812 |
| | | | 361/111 |
| 8,643,987 B2* | 2/2014 | Chu | H02H 9/046 |
| | | | 361/111 |
| 8,913,359 B2 | 12/2014 | Lai et al. | |
| 9,013,845 B1* | 4/2015 | Karp | H02H 9/041 |
| | | | 361/91.1 |
| 9,337,644 B2* | 5/2016 | Huang | H02H 9/046 |
| 9,337,651 B2 | 5/2016 | Lee | |
| 10,714,934 B2* | 7/2020 | Hsu | H10D 89/819 |
| 11,056,880 B1* | 7/2021 | Mathur | H10D 89/811 |
| 11,664,657 B2* | 5/2023 | Lai | H10D 89/819 |
| | | | 361/56 |
| 11,791,627 B2* | 10/2023 | Jiang | H02H 9/046 |
| | | | 361/56 |
| 12,381,387 B1* | 8/2025 | Leung | H03K 17/063 |
| 2003/0011949 A1* | 1/2003 | Ker | H10D 89/811 |
| | | | 361/56 |
| 2009/0067106 A1 | 3/2009 | Kim | |
| 2010/0001347 A1 | 1/2010 | Sugiura | |
| 2010/0254051 A1* | 10/2010 | Jeon | H02H 9/046 |
| | | | 361/56 |
| 2010/0302693 A1* | 12/2010 | Hayashi | H10D 89/601 |
| | | | 361/56 |
| 2014/0029144 A1* | 1/2014 | Kaku | H02H 9/046 |
| | | | 361/56 |
| 2017/0194317 A1* | 7/2017 | Wallis | H01L 23/5286 |
| 2018/0159318 A1* | 6/2018 | Chen | H02H 1/04 |
| 2021/0242677 A1* | 8/2021 | Langguth | H02H 9/046 |
| 2022/0052521 A1* | 2/2022 | Yoon | H02H 1/0007 |
| 2022/0352709 A1* | 11/2022 | Fan | H02H 9/046 |
| 2023/0116750 A1* | 4/2023 | Saccomanno | H02M 3/158 |
| | | | 323/222 |
| 2023/0361108 A1* | 11/2023 | Chen | H10D 89/813 |
| 2024/0178830 A1* | 5/2024 | Leong | H10D 89/611 |
| 2024/0321866 A1* | 9/2024 | Kang | H10D 89/819 |
| 2025/0063824 A1* | 2/2025 | Huang | H10D 89/60 |

* cited by examiner

ESD PROTECTION CIRCUITRY, AND ELECTRONIC DEVICE INCLUDING ESD PROTECTION CIRCUITRY

CROSS-REFERENCE TO RELATED APPLICATIONS

This application is based on and claims priority from Korean Patent Application No. 10-2023-0038950, filed on Mar. 24, 2023, and Korean Patent Application No. 10-2023-0054968, filed on Apr. 26, 2023, in the Korean Intellectual Property Office, the disclosures of which are incorporated by reference herein in their entireties.

BACKGROUND

1. Field

The disclosure relates to an electrostatic discharge (ESD) protection circuit, and more particularly, to a high voltage ESD protection circuit and an electronic device including the ESD protection circuit.

2. Description of Related Art

An ESD, which is one type of electrical overstress (EOS), refers to a phenomenon in which static charge accumulated between two objects having electric charges is transferred due to a triboelectric effect. An ESD event in a very small-scale semiconductor may entail high current and high voltage characteristics for a very short time that may cause malfunction and destruction of a circuit.

Various devices, such as a silicon controlled rectifier (SCR), a gate-grounded n-type metal-oxide semiconductor (GGNMOS), and a gate-coupled NMOS (GCNMOS), have been used as ESD protection devices to prevent ESD events in advance. Although SCRs have a high current driving capability and excellent tolerance characteristics in a unit area, SCRs may be difficult to be used when an internal circuit operates at a low voltage, and unwanted turn-on occurs. While the GGNMOS is easy to manufacture and control, it may be vulnerable to thermal deterioration.

SUMMARY

The disclosure provides an electrostatic discharge (ESD) protection circuit and an electronic device including the ESD protection circuit, capable of controlling the number of diodes of a clamping circuit so that a trigger voltage of an NMOS transistor is located between an operating voltage of a peripheral circuit and a breakdown voltage of the peripheral circuit.

The disclosure also provides an ESD protection circuit and an electronic device including the ESD protection circuit, capable of preventing a degradation of ESD performance by adding a gate-coupled GCPMOS switch in series to a clamping circuit.

According to an aspect example embodiments, there is provided an ESD protection circuit which may include: an n-type metal-oxide semiconductor (NMOS) transistor connected to a supply voltage pin through a first node and connected to a ground pin through a second node; a resistor-capacitor (RC) circuit connected in parallel with the NMOS transistor and including a capacitor and a resistor; and a clamping circuit connected in parallel with the resistor of the RC circuit and including a plurality of diodes; and a switch connecting the clamping circuit to a gate node of the NMOS transistor, wherein a number of the plurality of diodes is determined based on a breakdown voltage and an operating voltage of an internal circuit to be protected by the ESD protection circuit, and wherein the switch includes: a p-type metal-oxide semiconductor (PMOS) transistor connecting the gate node of the NMOS transistor to the clamping circuit; and a sub-RC circuit connected in parallel with the PMOS transistor and including a sub-capacitor and a sub-resistor.

According to an aspect of example embodiments, there is provided an electronic device which may include: an internal circuit connected to a supply voltage pin through a first node, connected to a ground pin through a second node, and configured to transmit or receive data through a plurality of input/output (I/O) pins; a first ESD protection circuit connected between the first node and the second node; and a plurality of second ESD protection circuits connected to each of the plurality of I/O pins, wherein the first ESD protection circuit includes: a first n-type metal-oxide semiconductor (NMOS) transistor including a drain terminal connected to the first node and a source terminal connected to the second node; a first RC circuit connected in parallel with the first NMOS transistor and including a capacitor and a resistor; a first clamping circuit connected in parallel with the resistor of the first RC circuit and including a plurality of first diodes; and a switch connected in series with the first clamping circuit and connected to a third node corresponding to a gate terminal of the NMOS transistor, wherein the switch comprises a p-type metal-oxide semiconductor (PMOS) transistor connecting the third node to the clamping circuit, and a sub-RC circuit connected in parallel with the PMOS transistor and including a sub-capacitor and a sub-resistor, and wherein a number of the plurality of first diodes is determined based on a breakdown voltage and an operating voltage of the internal circuit.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION OF EMBODIMENTS

Hereinafter, embodiments are described in detail with reference to the accompanying drawings. It is understood that the embodiments described herein are example embodiments, and thus, the disclosure may not be limited thereto.

It will be understood that, although the terms first, second, third, fourth, etc. may be used herein to describe various circuit elements, these elements should not be limited by these terms. These terms are only used to distinguish one element from another element. Thus, a first element described in the description section could be termed a second element in a claim section without departing from the teachings of the disclosure.

Figure 1:
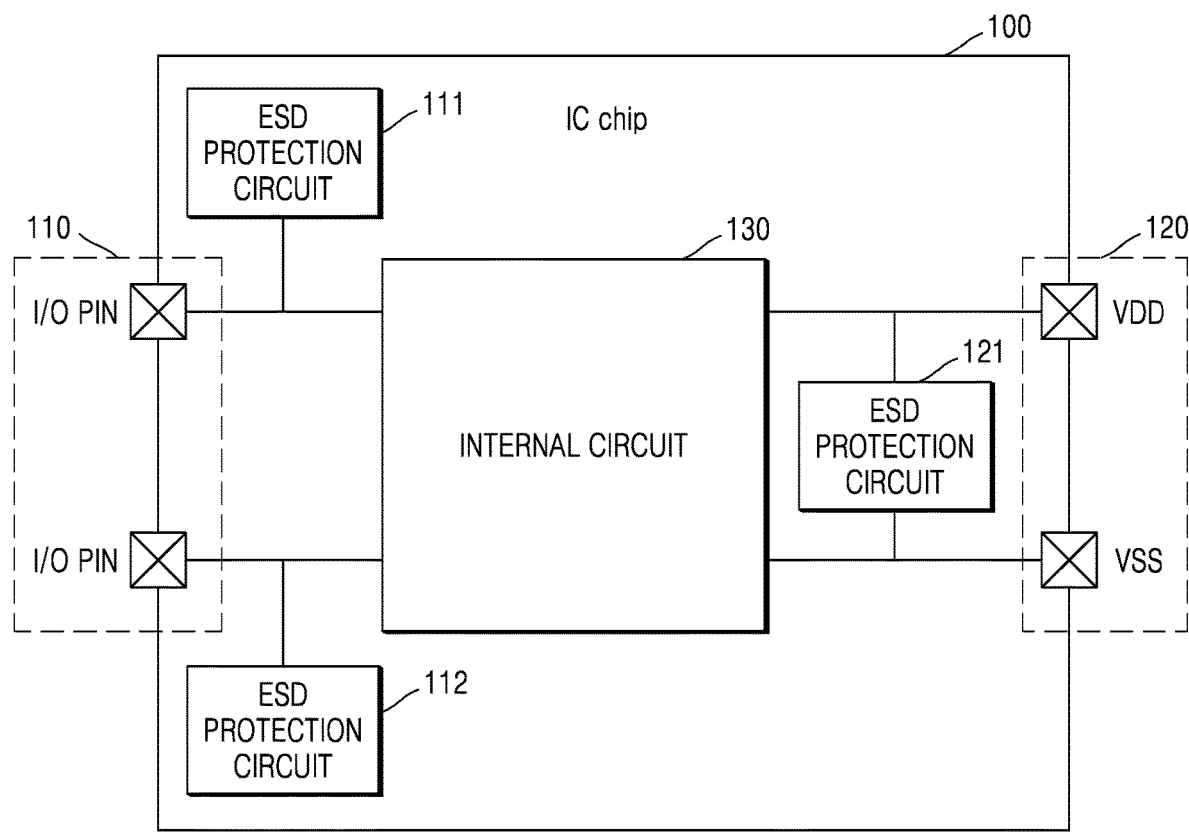
FIG. 1 illustrates an integrated circuit (IC) chip including an electrostatic discharge (ESD) protection circuit according to an embodiment.

FIG. 1 illustrates an integrated circuit (IC) chip 100 including an electrostatic discharge (ESD) protection circuit according to an embodiment.

Referring to FIG. 1, the IC chip 100 may include input/output (I/O) pins 110, power supply pins 120, an internal circuit 130, and a plurality of ESD protection circuits 111, 112, and 121.

The I/O pins 110 may include an input pin for receiving input data to be received by the IC chip 100 and an output pin for transmitting output data to the outside of the IC chip 100. The I/O pins 110 may be connected to the internal circuit 130. According to an embodiment, the ESD protection circuits 111 and 112 may be connected to the I/O pins 110, respectively. For example, the ESD protection circuit 111 may be connected to an input data path connecting an input pin to the internal circuit 130. The ESD protection circuit 111 provided on the input data path may be a circuit for discharging ESD applied to the input pin to ground. As another example, the ESD protection circuit 112 may be connected to an output data path connecting the output pin to the internal circuit 130. The ESD protection circuit 112 provided on the output data path may be a circuit for discharging ESD applied to an output pin to ground.

The power supply pins 120 may be pins for supplying power required to drive the internal circuit 130. For example, the power supply pins 120 may include a VDD pin and a VSS pin. The VDD pin may be a pin to which a supply voltage is applied. The VSS pin may be a pin connected to ground. The VDD pin may be connected to the VSS pin through the ESD protection circuit 121. The ESD protection circuit 121 connected between the power supply pins 120 may be a circuit for discharging ESD applied to the VDD pin through the VSS pin. The voltage applied to the I/O pins 110 may be relatively lower than a voltage applied to the power supply pins 120. The internal circuit 130 may discharge ESD applied to the IC chip 100 to ground through the ESD protection circuits 111 and 121 provided for each I/O pin 110 and the ESD protection circuit 121 connected between the power supply pins 120, thereby preventing malfunction and destruction of the IC chip 100 in advance.

Figure 2:
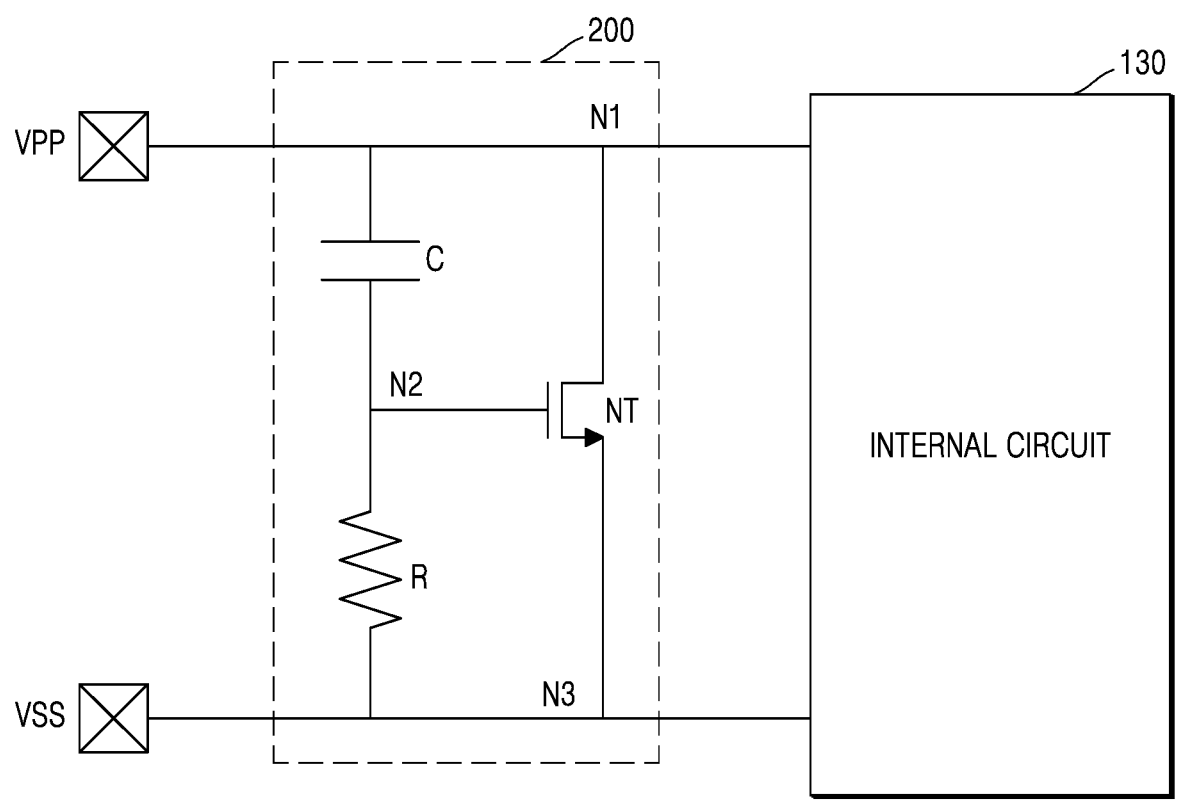
FIG. 2 illustrates an ESD protection circuit according to an embodiment.

FIG. 2 illustrates an ESD protection circuit 200 according to an embodiment.

Referring to FIG. 2, the ESD protection circuit 200 according to an embodiment may include an NMOS transistor NT and an RC circuit connected in parallel with the NMOS transistor NT.

The ESD protection circuit 200 according to the embodiment may correspond to the ESD protection circuit 121 connected between the power supply pins 120 of FIG. 1.

A drain terminal of the NMOS transistor NT may be connected to a first node N1. The first node N1 may be connected to a VPP pin, and a voltage level of the first node N1 may be the same as a supply voltage. For example, when an ESD event occurs, an impulse voltage may be applied to the VPP pin. Accordingly, the voltage level of the first node N1 may rapidly increase.

A gate terminal of the NMOS transistor NT may be connected to a second node N2. The second node N2 may be a node between a resistor R and a capacitor C of the RC circuit. One end of the capacitor C may be connected to the first node N1 and the other end thereof may be connected to the second node N2. One end of the resistor R may be connected to the second node N2 and the other end thereof may be connected to a third node N3.

When an ESD event occurs and an impulse voltage is applied through the VPP pin, the impulse voltage may be coupled to the capacitor C. That is, when the impulse voltage is momentarily applied to the VPP pin, the capacitor C may operate as a short circuit, so that a voltage level of the second node N2 may be boosted by the magnitude of impulse. The voltage level of the second node N2 boosted by the magnitude of the impulse may exponentially decrease based on a time constant r, which is a product of a resistance of the resistor R and a capacitance of the capacitor C.

According to an embodiment, when an ESD event occurs, the voltage level of the second node N2 may increase based on the coupling of the capacitor C, and accordingly, a trigger voltage of the NMOS transistor NT may decrease. The trigger voltage refers to a voltage at which an avalanche breakdown occurs in a reverse bias between a body and the drain terminal of the NMOS transistor NT. That is, when a voltage equal to or higher than the trigger voltage is applied to the drain terminal of the NMOS transistor NT, an avalanche breakdown may occur. Here, as the voltage level of the second node N2 of the gate terminal increases, the trigger voltage may decrease and an avalanche breakdown may occur at a lower voltage.

Figure 3:
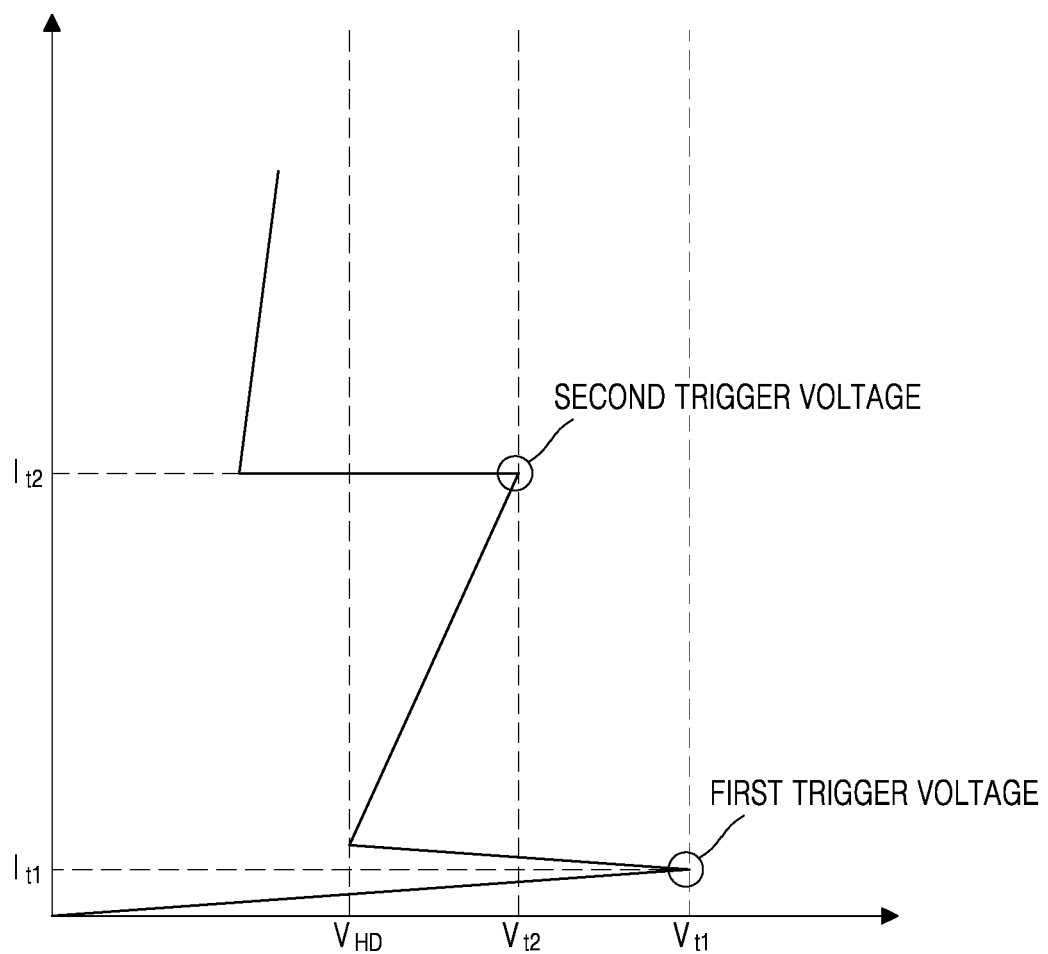
FIG. 3 is a graph illustrating IV curves of a drain voltage and a drain current of the ESD protection circuit according to an embodiment.

FIG. 3 is a graph illustrating IV curves of a drain voltage and a drain current of the ESD protection circuit 200 according to an embodiment.

Referring to FIGS. 2 and 3, based on the occurrence of an ESD event, the voltage level of the first node N1 of the drain terminal may rapidly increase. As described above, the moment the voltage level of the first node N1 reaches a first trigger voltage, an avalanche breakdown may occur. As avalanche breakdown occurs, a base current may be formed. The base current is a base current of a parasitic bipolar junction transistor (BJT) of the NMOS transistor NT. The parasitic BJT may be an NPN type parasitic BJT in which the drain terminal of the NMOS transistor NT is 'N,' a substrate of the NMOS transistor NT is 'P,' and a source terminal of the NMOS transistor NT is 'N.' A body voltage may increase by the base current to form a forward bias, and accordingly, an ESD current of the drain terminal may flow to a ground pin through the source terminal.

When the ESD current flows to the ground pin through the source terminal, the voltage of the first node N1 of the drain terminal may gradually decrease, and at this time, the lowest voltage level may correspond to a holding voltage.

After the voltage of the first node N1 of the drain terminal decreases to the holding voltage, a large current may flow in a snapback period even if the voltage is lower than the first trigger voltage. This is because the avalanche breakdown has already triggered a current flow between a collector and an emitter. Thereafter, when the voltage level of the first node N1 increases again to reach a second trigger voltage, a thermal failure may occur. That is, if the voltage of the first node N1 increases in the snapback period and the drain current becomes too large, a temperature of the ESD protection circuit 200 may increase and the ESD protection circuit 200 may be destroyed.

Figure 4:
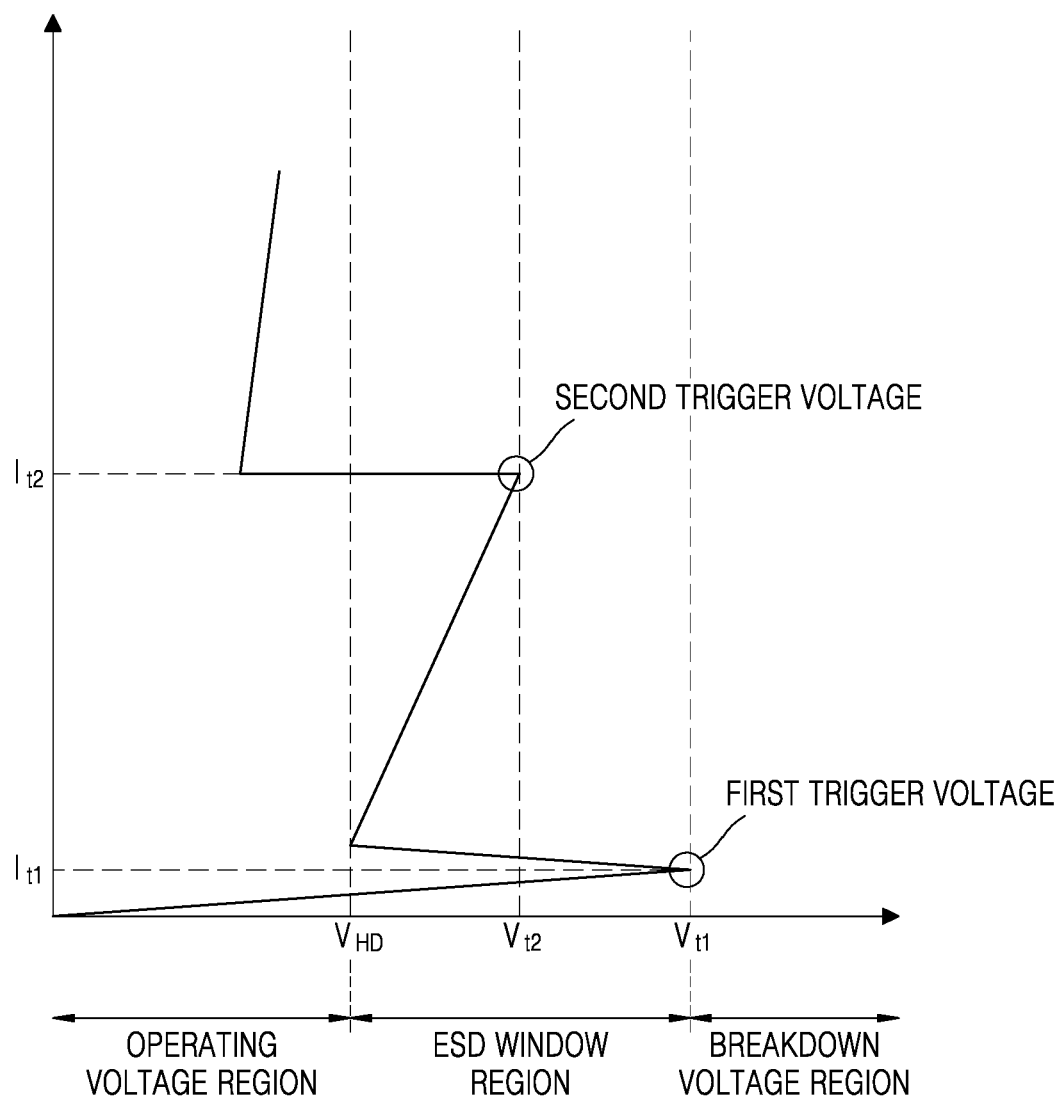
FIG. 4 illustrates a graph of an ESD design window according to an embodiment.

FIG. 4 illustrates a graph of an ESD design window according to an embodiment.

Referring to FIG. 4, a breakdown voltage may be greater than a first trigger voltage $V_{t1}$ and a second trigger voltage $V_{t2}$. The breakdown voltage refers to a voltage level at which the internal circuit 130 of FIG. 1 malfunctions or is destroyed. The first trigger voltage $V_{t1}$ and the second trigger voltage $V_{t2}$ have to be smaller than the breakdown voltage. If the first trigger voltage $V_{t1}$ and the second trigger voltage $V_{t2}$ are greater than the breakdown voltage, the internal circuit 130 may already reach the breakdown voltage and be destroyed before the NMOS transistor NT is turned on to discharge the ESD current.

According to an embodiment, an operating voltage may be smaller than a holding voltage $V_{HD}$. The operating voltage refers to a voltage level required for the internal circuit 130 to normally operate. The holding voltage $V_{HD}$ should be greater than the operating voltage. This is because, if the holding voltage $V_{HD}$ is lower than the operating voltage, a large ESD current flows in a snapback operation region after an avalanche breakdown occurs due to the first trigger voltage $V_{t1}$, and thus, even if the ESD event terminates and the internal circuit 130 operates at the operating voltage, the ESD current is not resolved.

Figure 5:
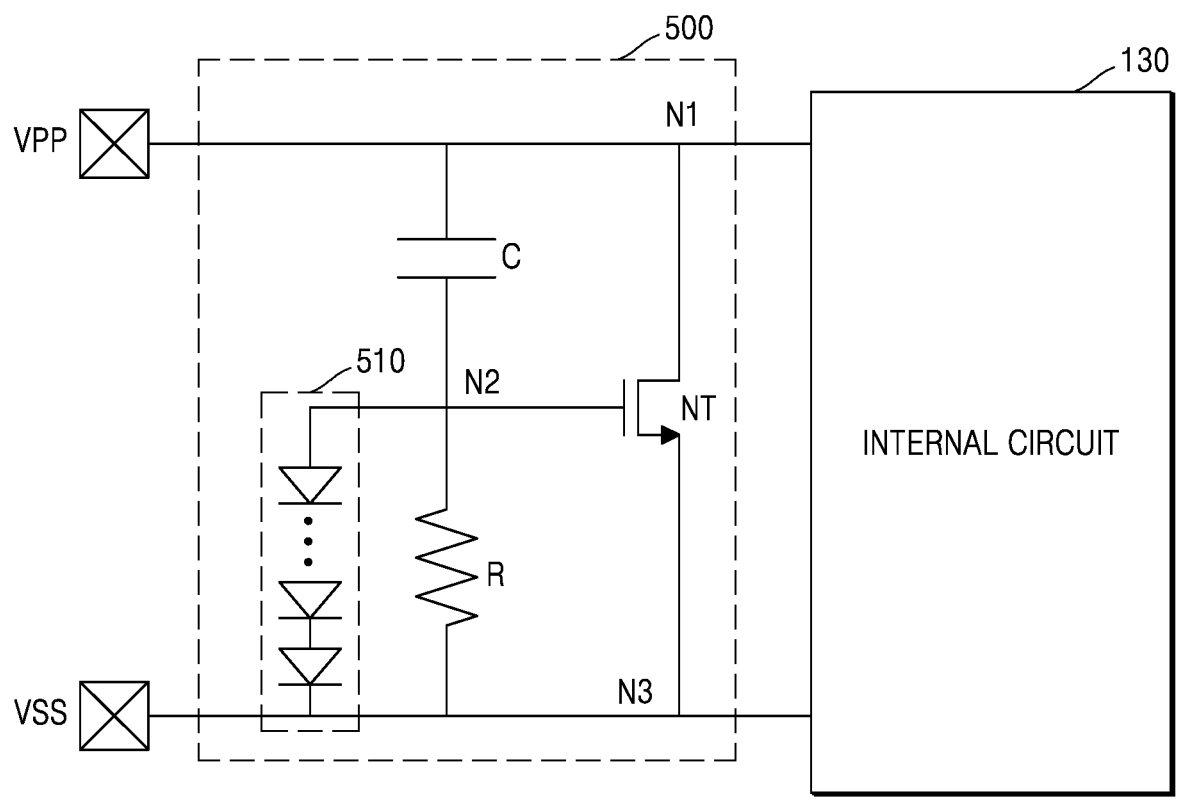
FIG. 5 illustrates an ESD protection circuit according to an embodiment.

FIG. 5 illustrates an ESD protection circuit 500 according to an embodiment.

Referring to FIG. 5, the ESD protection circuit 500 according to an embodiment may include a clamping circuit 510 connected in parallel with the resistor R of the RC circuit connected in parallel with the NMOS transistor NT, in view of the ESD protection circuit 200 of FIG. 2.

The drain terminal of the NMOS transistor NT may be connected to the first node N1. The first node N1 may be connected to the VPP pin, and a voltage level of the first node N1 may be the same as a supply voltage. For example, when an ESD event occurs, an impulse voltage may be applied to the VPP pin. Accordingly, the voltage level of the first node N1 may rapidly increase.

The gate terminal of the NMOS transistor NT may be connected to the second node N2. The second node N2 may be disposed between the resistor R and the capacitor C of the RC circuit. One end of the capacitor C may be connected to the first node N1 and the other end thereof may be connected to the second node N2. One end of the resistor R may be connected to the second node N2 and the other end thereof may be connected to the third node N3.

When an ESD event occurs and an impulse voltage is applied through the VPP pin, the impulse voltage may be coupled to the capacitor C. That is, when the impulse voltage is momentarily applied to the VPP pin, the capacitor C may operate as a short circuit, so that a voltage level of the second node N2 may be boosted by the magnitude of impulse. The voltage level of the second node N2 boosted by the magnitude of the impulse may exponentially decrease based on a time constant τ, which is the product of the resistance of the resistor R and the capacitance of the capacitor C.

The source terminal of the NMOS transistor NT may be connected to the third node N3. The third node N3 may be connected to the VSS pin. The clamping circuit 510 may be connected between the second node N2 and the third node N3. That is, the clamping circuit 510 may be connected in parallel with the resistor R of the RC circuit. The clamping circuit 510 may include a plurality of diodes. A voltage level of the second node N2 may be determined according to the number of the diodes. For example, when an ESD event occurs, the maximum value of the voltage level of the second node N2 may be proportional to the number of the diodes. For example, when the number of diodes of the clamping circuit 510 is N, which is an integer greater than 0, the maximum value of the voltage level of the second node N2 may be 0.7 [V]×N.

The maximum value of the voltage level of the second node N2 may be determined according to the number of diodes included in the clamping circuit 510, and the first trigger voltage $V_{t1}$ may vary based on the maximum value. For example, when the number of diodes increases, the maximum value may also increase, and accordingly, the first trigger voltage $V_{t1}$ may decrease. This is because the first trigger voltage $V_{t1}$ is in inversely proportional to the voltage level of the second node N2, which is the gate terminal of the NMOS transistor NT.

Figure 6:
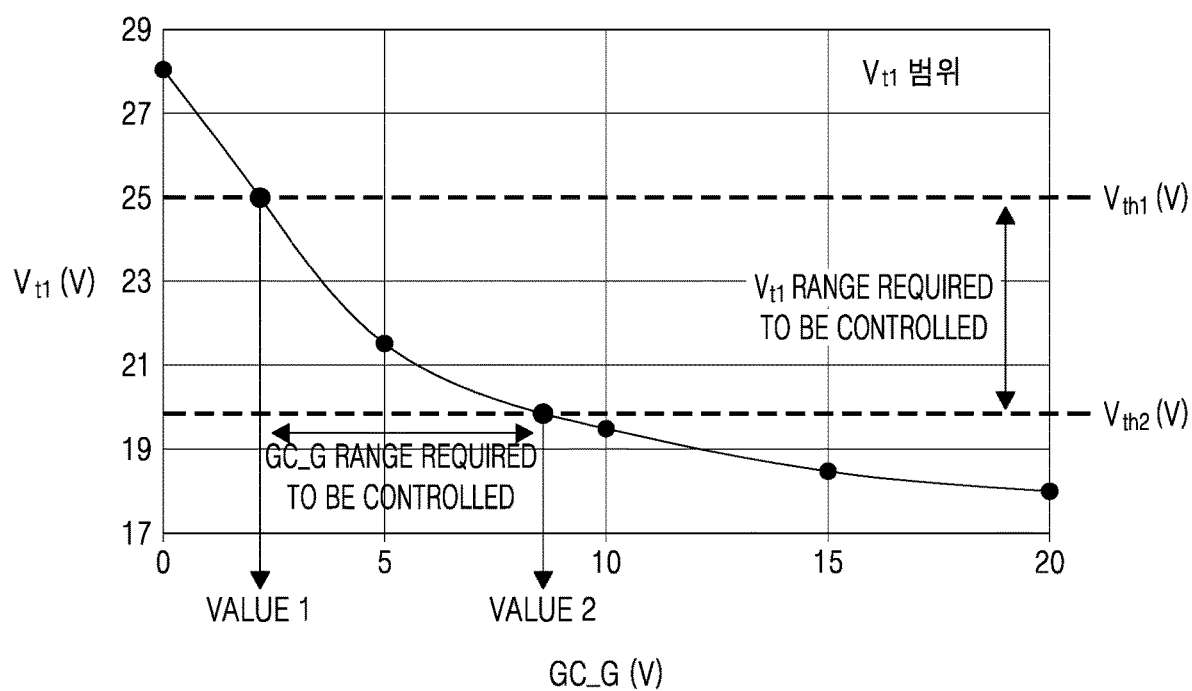
FIG. 6 is a graph illustrating a relationship between the gate voltage and the trigger voltage of the NMOS transistor NT of the ESD protection circuit 500 according to an embodiment.

FIG. 6 is a graph illustrating a relationship between the gate voltage and the trigger voltage of the NMOS transistor NT of the ESD protection circuit 500 according to an embodiment.

Referring to FIG. 6, a graph illustrating a relationship between a voltage level applied to the gate terminal of the NMOS transistor NT and a voltage level of the first trigger voltage $V_{t1}$ according to the present embodiment is shown. The X axis may be a voltage level of the gate terminal of the NMOS transistor NT, that is, a voltage level of the second node N2. The Y axis may be a voltage level of the first trigger voltage $V_{t1}$ of FIG. 3 or the first trigger voltage $V_{t1}$ of FIG. 4.

According to the present embodiment, as the voltage applied to the gate terminal of the NMOS transistor NT increases, a reverse bias between the body and the drain terminal of the NMOS transistor NT may significantly increase, and accordingly, an avalanche breakdown may easily occur even if the voltage applied to the drain terminal is lower. Accordingly, the voltage level applied to the gate terminal may be in inversely proportional to the voltage level of the first trigger voltage $V_{t1}$.

According to the present embodiment, the number of diodes included in the clamping circuit 510 may be determined. First, the voltage level of the first trigger voltage $V_{t1}$ on the Y axis may be considered. For example, as described above, because the first trigger voltage $V_{t1}$ has to be smaller than the breakdown voltage of the internal circuit 130, the first trigger voltage $V_{t1}$ has to be included in a range smaller than a first threshold voltage $V_{th1}$. As another example, because the first trigger voltage $V_{t1}$ has to not operate in a non-ESD event, the first trigger voltage $V_{th1}$ has to be greater than an operating voltage. Therefore, the first trigger voltage $V_{t1}$ has to be included in a range greater than the second threshold voltage $V_{th2}$. When the range of the first trigger voltage $V_{t1}$ is determined, the number of diodes of the clamping circuit 510 may be determined based on the range. For example, the number of diodes may be greater than a first value VALUE 1, which is the minimum, required for the first trigger voltage $V_{t1}$ not to exceed the first threshold value. As another example, the number of diodes may be less than a second value VALUE 2, which is the maximum, required for the first trigger voltage $V_{t1}$ to be set higher than the second threshold value.

Figure 7:
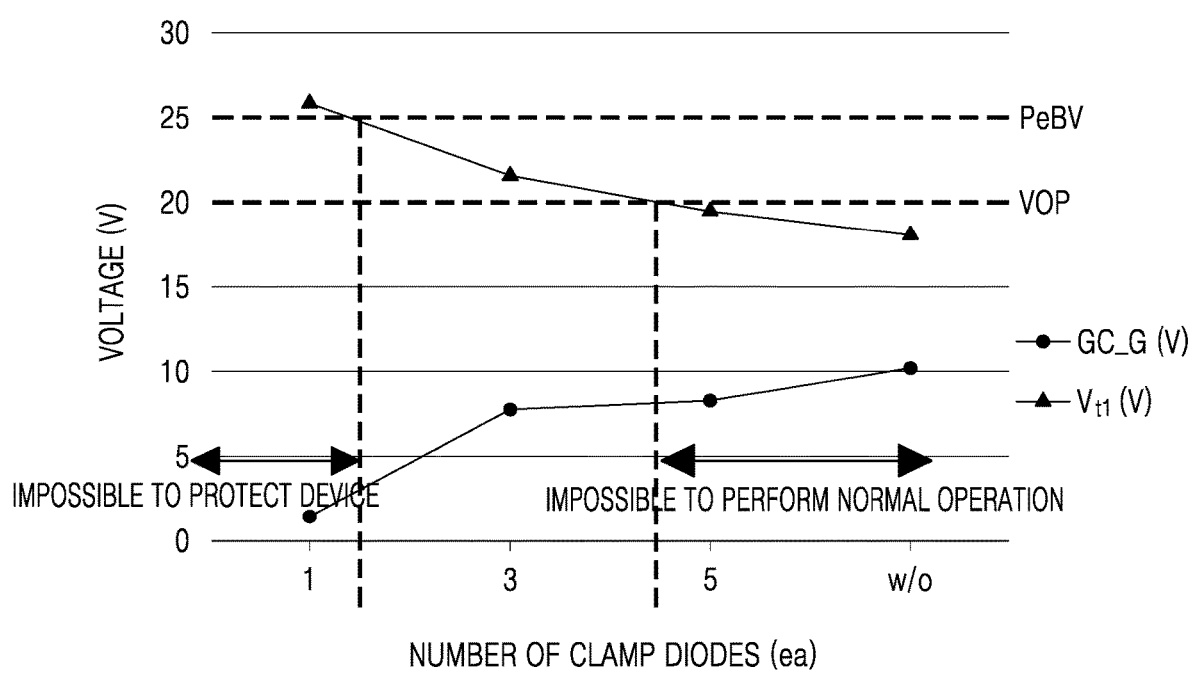
FIG. 7 illustrates an example of determining the number of diodes of a clamping circuit according to an embodiment.

FIG. 7 illustrates an example of determining the number of diodes of the clamping circuit 510 according to an embodiment.

Referring to FIG. 7, a graph of a relationship between a voltage level of the gate terminal according to the number of diodes included in the clamping circuit 510 and the first trigger voltage $V_{t1}$ is shown. Because the diodes included in the clamping circuit 510 are connected in series, it can be seen that the maximum value at which the voltage level of the second node N2 of the gate terminal is limited gradually increases as the number of diodes increases. Also, as described above, because the first trigger voltage $V_{t1}$ is in inversely proportional to the voltage level of the gate terminal, it can be seen that the first trigger voltage $V_{t1}$ decreases as the number of diodes increases.

According to the present embodiment, the voltage level of the breakdown voltage PeBV may be 25 [V]. For example, the breakdown voltage PeBV refers to a voltage causing the peripheral circuit to breakdown. To protect the internal circuit 130 from ESD events, the first trigger voltage $V_{t1}$ cannot exceed 25 [V]. Accordingly, it can be seen that the number of diodes satisfying the condition related to the breakdown voltage PeBV is at least two.

According to the present embodiment, the voltage level of the operating voltage VOP may be 20 [V]. The operating voltage VOP refers to a voltage required for the internal circuit 130 to operate normally. In order not to trigger the NMOS transistor NT of the ESD protection circuit 500 in a normal operating situation other than an ESD event, the first trigger voltage $V_{t1}$ cannot be less than 20 [V]. Accordingly, it can be seen that the maximum number of diodes satisfying the conditions related to the operating voltage VOP is four (4) or less.

In conclusion, in the case of an electronic device including the internal circuit 130 having a high operating voltage VOP of 20 [V] and a breakdown voltage PeBV of 25 [V], the number of diodes included in the clamping circuit 510 without incurring additional process costs may be determined to be two (2) to four (4), thereby protecting devices from an ESD event, while a high voltage operation is ensured.

According to the present embodiment, it is confirmed that the ESD protection circuit 500 further includes the clamping circuit 510, and the number of diodes included in the clamping circuit 510 may be set to appropriately decrease the first trigger voltage $V_{t1}$, thereby controlling the NMOS transistor NT to be turned on at a voltage smaller than the breakdown voltage PeBV and a voltage greater than the high level operating voltage. However, because the clamping circuit 510 still performs a clamping operation even during an ESD event, the first trigger voltage $V_{t1}$ may be boosted to cause deterioration in ESD performance. Therefore, an additional configuration for selectively inactivating the clamping circuit 510 in the case of the ESD event and selectively activating the clamping circuit 510 only during a normal operation is necessary FIG. 8 illustrates an ESD protection circuit 800 according to an embodiment.

Figure 8:
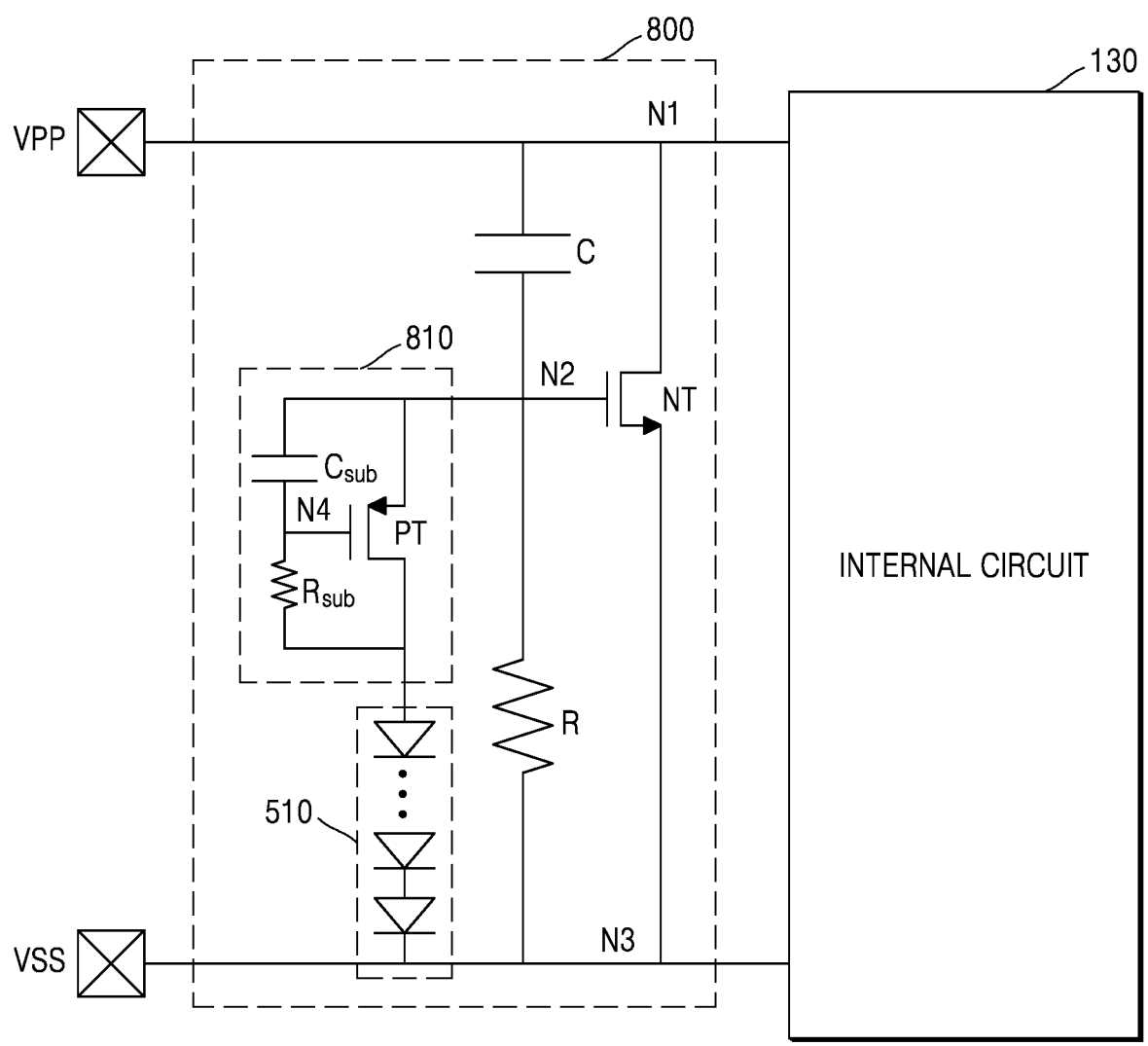
FIG. 8 illustrates an ESD protection circuit according to one or more embodiments.

Referring to FIG. 8, the ESD protection circuit 800 according to an embodiment may further include a switch 810 for selectively connecting the clamping circuit 510 to the second node N2 according to an ESD event or a normal operation in view of the ESD protection circuit 500. The switch 810 may be a sub-gate coupled PMOS (GCPMOS). For example, the switch 810 may connect the second node N2 to the clamping circuit 510. The switch 810 may include a PMOS transistor PT connecting the second node N2 to the clamping circuit 510 and a sub-RC circuit connected in parallel with the PMOS transistor PT. The sub-RC circuit may include a sub-resistor $R_{sub}$ connecting a fourth node N4 corresponding to a gate node of the PMOS transistor PT to the clamping circuit 510 and a sub-capacitor $C_{sub}$ connecting the fourth node N4 corresponding to the gate node of the PMOS transistor PT to the second node N2 corresponding to the gate node of the NMOS transistor NT.

Figure 9:
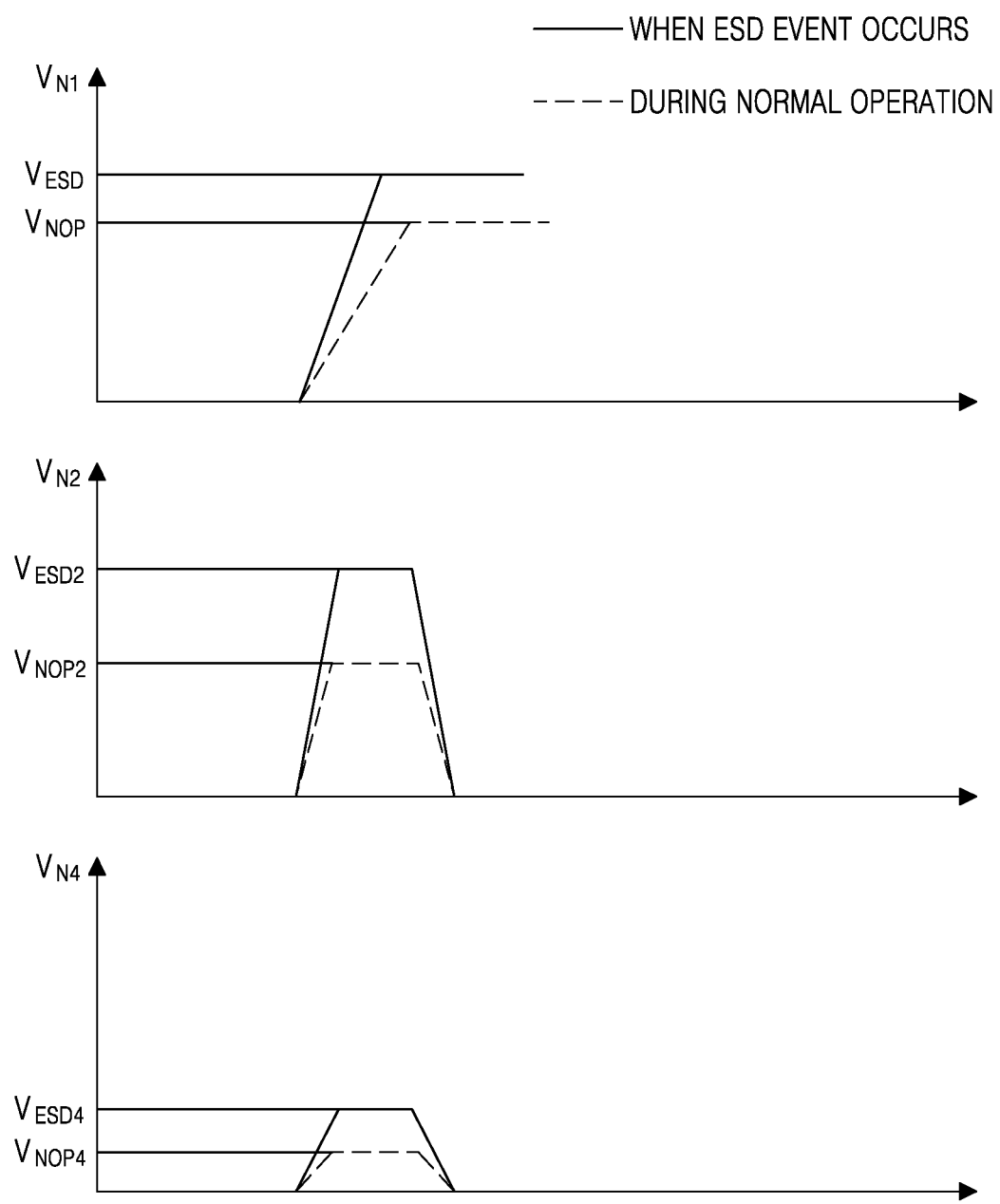
FIG. 9 is a graph illustrating voltage levels for each node in each of an ESD event and a normal operation event according to an embodiment.

FIG. 9 is a graph illustrating voltage levels for each node in an ESD event and a normal operation event according to an embodiment.

Referring to FIG. 9, when an ESD event occurs, an impulse voltage $V_{ESD}$ may be applied to the VPP pin. When the impulse voltage $V_{ESD}$ is applied through the VPP pin, the impulse voltage may be coupled to the capacitor C. When the impulse voltage is momentarily applied to the VPP pin, the capacitor C may operate as a short circuit, so that a voltage level of the second node N2 may be boosted by the magnitude of impulse. ($V_{ESD}$=$V_{ESD2}$). The voltage of the second node N2 may be coupled back to the sub-capacitor $C_{sub}$ connected to the second node N2. When the sub-capacitor $C_{sub}$ is coupled, the sub-capacitor $C_{sub}$ momentarily operates as a short circuit so that the voltage level of the fourth node N4, which is the gate node of the PMOS transistor PT, may follow the voltage level of the second node N2. A gate-source voltage difference $V_{GS}$ of the PMOS transistor PT is a value obtained by subtracting the voltage level $V_{ESD4}$ of the fourth node N4 from the voltage level $V_{ESD2}$ of the second node N2. Because the voltage level $V_{ESD4}$ of the fourth node N4 follows the voltage level $V_{ESD2}$ of the second node N2, the magnitude of the gate-source voltage difference $V_{GS}$ of the PMOS transistor PT may be relatively small and may not be enough to turn on the PMOS transistor PT. That is, in an ESD event, the PMOS transistor PT may be turned off, and in the ESD event, the second node N2 of the NMOS transistor NT may not be electrically connected to the clamping circuit 510.

According to an embodiment, a normal operation event may occur. When the normal operation event occurs, an operating voltage $V_{NOP}$ that is boosted according to a low slope may be applied to the VPP pin. When the low-slope operating voltage $V_{NOP}$ is applied through the VPP pin, each of the capacitor C and the sub-capacitor C may operate as a resistor device. The sub-capacitor $C_{sub}$ may operate as a resistor device so that the rate at which the voltage level $V_{NOP4}$ of the fourth node N4, which is the gate node of the PMOS transistor PT, follows the voltage level $V_{NOP2}$ of the second node N2 may be slow. Accordingly, the magnitude of the gate-source voltage difference $V_{GS}$ of the PMOS transistor PT may relatively increase compared to when the ESD event occurs. As the magnitude of the gate-source voltage difference $V_{GS}$ of the PMOS transistor PT increases, the PMOS transistor PT may be turned on in the normal operation event. Because the PMOS transistor PT is turned on in the normal operation event, the second node N2 of the NMOS transistor NT may be electrically connected to the clamping circuit 510. As the second node N2 is connected to the clamping circuit 510, the voltage level $V_{NOP2}$ of the second node N2 may further drop.

Figure 10:
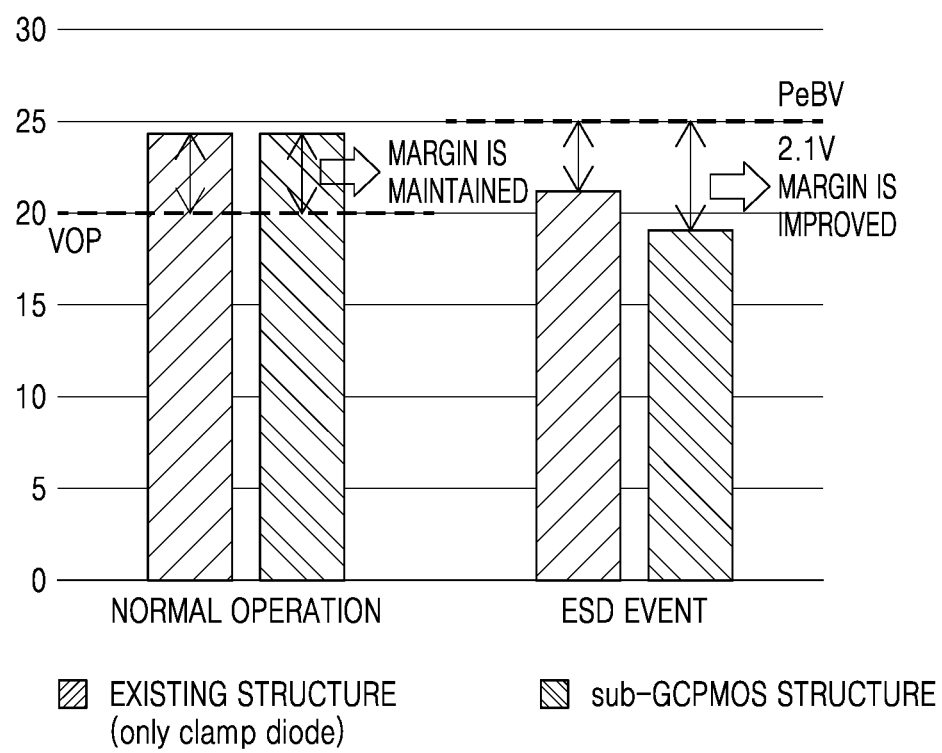
FIG. 10 is a graph illustrating margin improvement in each of an ESD event and a normal operation event according to an embodiment.

According to the present embodiment, the ESD protection circuit 800 includes the GC-PMOS switch 810 in series with the clamping circuit 510, so that, in the ESD event, the second node N2 and the clamping circuit 510 may be electrically opened to prevent deterioration of the ESD performance, and in the normal operation event, the second node N2 may be electrically connected to the clamping circuit 510. FIG. 10 is a graph illustrating margin improvement in an ESD event and a normal operation event according to an embodiment. Referring to FIG. 10, it may be confirmed that the same voltage margin is maintained as in the ESD protection circuit 500 of the previous embodiment in the normal operation event. The reason why the voltage margins of the ESD protection circuit 500 and the ESD protection circuit 800 are the same in the normal operation event is because the PMOS transistor PT is turned on and the second node N2 is connected to the clamping circuit 510. In the ESD event, it may be confirmed that the voltage margin is improved, compared to the ESD protection circuit 500 of the second comparative example. That is, the ESD protection circuit 800 according to the present embodiment has a larger margin from the breakdown voltage PeBV. The ESD protection circuit 800 has a larger voltage margin because the PMOS transistor PT is turned off and is not electrically connected to the clamping circuit 510 at the second node N2.

Figure 11:
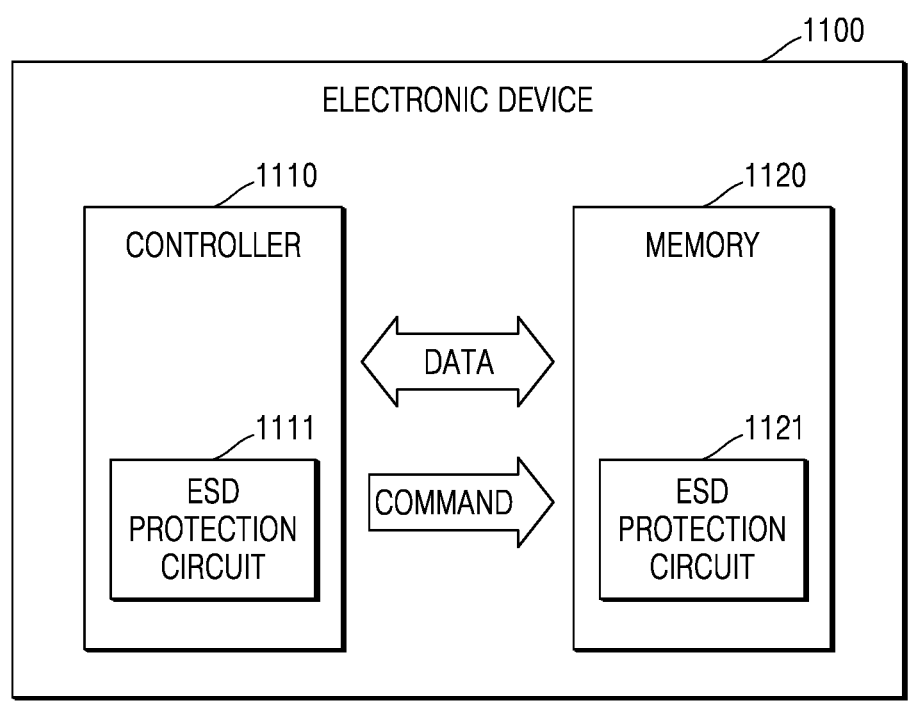
FIG. 11 illustrates an example of an electronic device according to an embodiment.

FIG. 11 illustrates an example of an electronic device 1100 according to an embodiment.

Referring to FIG. 11, in the electronic device 1100, a controller 1110 and a memory 1120 may be located to exchange electrical signals. For example, when a command is issued by the controller 1110, the memory 1120 may write or read data. Each of the controller 1110 and the memory 1120 may include an IC chip according to embodiments. In detail, each of the IC chips included in the controller 1110 and the memory 1120 may include the ESD protection circuits 1111 and 1121 described in the embodiment. The controller 710 or the memory 720 may include at least one pad, and the ESD protection circuit according to the present embodiment may be connected between the at least one pad to prevent permanent damage caused by an ESD event in advance.

While the disclosure has been particularly shown and described with reference to embodiments thereof, it will be understood that various changes in form and details may be made therein without departing from the spirit and scope of the disclosure.

What is claimed is:

1. An electrostatic discharge (ESD) protection circuit comprising:
    an n-type metal-oxide semiconductor (NMOS) transistor connected to a supply voltage pin through a first node and connected to a ground pin through a second node;
    a resistor-capacitor (RC) circuit connected in parallel with the NMOS transistor and comprising a capacitor and a resistor; and
    a clamping circuit connected in parallel with the resistor of the RC circuit and comprising a plurality of diodes, a number of which is set based on a breakdown voltage and an operating voltage of an internal circuit to be protected by the ESD protection circuit; and
    a switch connecting the clamping circuit to a gate node of the NMOS transistor, and comprising:
        a p-type metal-oxide semiconductor (PMOS) transistor connecting the gate node of the NMOS transistor to the clamping circuit; and
        a sub-RC circuit connected in parallel with the PMOS transistor and comprising a sub-capacitor and a sub-resistor.

2. The ESD protection circuit of claim 1, wherein the internal circuit is connected to the supply voltage pin through the first node, connected to the ground pin through the second node, and connected in parallel with the ESD protection circuit.

3. The ESD protection circuit of claim 1, wherein the NMOS transistor comprises a gate terminal connected to a third node, a drain terminal connected to the first node, and a source terminal connected to the second node,
    wherein the resistor of the RC circuit is connected between the second node and the third node, and
    wherein the sub-resistor of the sub-RC circuit connects a fourth node corresponding to a gate node of the PMOS transistor to the clamping circuit.

4. The ESD protection circuit of claim 3, wherein the capacitor of the RC circuit is connected between the first node and the third node, and
    wherein the sub-capacitor of the sub-RC circuit connects the third node to the fourth node.

5. The ESD protection circuit of claim 4, wherein the NMOS transistor is configured to receive an ESD voltage, at the drain terminal, the ESD voltage being input through the supply voltage pin, and
    wherein based on the ESD voltage exceeding a trigger voltage, the NMOS transistor is configured to discharge an ESD current through the source terminal.

6. The ESD protection circuit of claim 5, wherein the trigger voltage is inversely proportional to a voltage level of the third node corresponding to the gate terminal of the NMOS transistor.

7. The ESD protection circuit of claim 6, wherein the number of the plurality of diodes is set so that the trigger voltage is lower than the breakdown voltage and higher than the operating voltage.

8. The ESD protection circuit of claim 7, wherein the PMOS transistor is configured to be turned off based on the ESD voltage being input through the supply voltage pin.

9. An electronic device comprising:
    an internal circuit connected to a supply voltage pin through a first node, connected to a ground pin through a second node, and configured to transmit or receive data through a plurality of input/output (I/O) pins;
    a first electrostatic discharge (ESD) protection circuit connected between the first node and the second node; and
    a plurality of second ESD protection circuits connected to each of the plurality of I/O pins,
    wherein the first ESD protection circuit comprises:
        a first n-type metal-oxide semiconductor (NMOS) transistor comprising a drain terminal connected to the first node and a source terminal connected to the second node;
        a first RC circuit connected in parallel with the first NMOS transistor and comprising a capacitor and a resistor;
        a first clamping circuit connected in parallel with the resistor of the first RC circuit and comprising a plurality of first diodes a number of which is set based on a breakdown voltage and an operating voltage of an internal circuit to be protected by the ESD protection circuit; and
        a switch connected in series with the first clamping circuit and connected to a third node corresponding to a gate terminal of the NMOS transistor,
    wherein the switch comprises a p-type metal-oxide semiconductor (PMOS) transistor connecting the third node to the first clamping circuit, and a sub-RC circuit connected in parallel with the PMOS transistor and including a sub-capacitor and a sub-resistor.

10. The electronic device of claim 9, wherein the resistor of the first RC circuit is connected between the second node and the third node, and wherein the sub-resistor of the sub-RC circuit connects the first clamping circuit to a fourth node corresponding to a gate terminal of the PMOS transistor.

11. The electronic device of claim 10, wherein the capacitor of the first RC circuit is connected between the first node and the third node, and
wherein the sub-capacitor of the sub-RC circuit is connected between the third node and the fourth node.

12. The electronic device of claim 10, wherein the first NMOS transistor is configured to receive an ESD voltage, at the drain terminal, the ESD voltage being input through the supply voltage pin, and
wherein based on the ESD voltage exceeding a trigger voltage, the first NMOS transistor is configured to discharge an ESD current through the source terminal.

13. The electronic device of claim 12, wherein the trigger voltage is inversely proportional to a voltage level of the third node corresponding to the gate terminal of the first NMOS transistor.

14. The electronic device of claim 13, wherein the number of the plurality of first diodes is set so that the trigger voltage is lower than the breakdown voltage and higher than the operating voltage.

15. The electronic device of claim 14, wherein the PMOS transistor is turned off based on the ESD voltage being input through the supply voltage pin.

16. The electronic device of claim 9, wherein each of the plurality of second ESD protection circuits comprises:
a second NMOS transistor comprising a drain terminal connected to an I/O pin and a source terminal connected to a ground node;
a second RC circuit connected in parallel with the second NMOS transistor and comprising a capacitor and a resistor; and
a second clamping circuit connected in parallel with the resistor of the second RC circuit and comprising a plurality of second diodes,
wherein a number of the plurality of second diodes is determined based on a breakdown voltage of the internal circuit.

17. The electronic device of claim 16, wherein the resistor of the second RC circuit is connected between the source terminal and the gate terminal,
wherein the second clamping circuit is connected between the source terminal and the gate terminal, and wherein the capacitor of the second RC circuit is connected between the drain terminal and the gate terminal of the second NMOS.

18. The electronic device of claim 17, wherein the second NMOS transistor is configured to receive an ESD voltage input through the I/O pin by the drain terminal, and
wherein based on the ESD voltage exceeding a trigger voltage, the second NMOS transistor is configured to discharge an ESD current through the source terminal.

19. The electronic device of claim 18, wherein the trigger voltage is inversely proportional to a voltage level of the gate terminal of the second NMOS transistor, and
wherein the number of the plurality of second diodes is set so that the trigger voltage is lower than the breakdown voltage.

20. An electrostatic discharge (ESD) protection circuit comprising:
an n-type metal-oxide semiconductor (NMOS) transistor connected to a supply voltage pin through a first node and connected to a ground pin through a second node;
a resistor-capacitor (RC) circuit connected in parallel with the NMOS transistor and comprising a capacitor and a resistor; and
a clamping circuit connected in parallel with the resistor of the RC circuit and comprising at least one diode; and
a switch connecting the clamping circuit to a gate node of the NMOS transistor, and comprising:
a p-type metal-oxide semiconductor (PMOS) transistor connecting the gate node of the NMOS transistor to the clamping circuit; and
a sub-RC circuit connected in parallel with the PMOS transistor and comprising a sub-capacitor and a sub-resistor.

* * * * *